(12) United States Patent
Schrödinger

(10) Patent No.: US 7,036,999 B2
(45) Date of Patent: May 2, 2006

(54) OPTOELECTRONIC MODULE AND OPTOELECTRONIC SYSTEM

(76) Inventor: Karl Schrödinger, Setheweg 12, 14089 Berlin (DE)

( * ) Notice: Subject to any disclaimer, the term of this patent is extended or adjusted under 35 U.S.C. 154(b) by 0 days.

(21) Appl. No.: 10/845,627

(22) Filed: May 14, 2004

(65) Prior Publication Data

US 2005/0254745 A1    Nov. 17, 2005

(51) Int. Cl.
*G02B 6/36* (2006.01)
(52) U.S. Cl. .......................................... 385/88; 385/94
(58) Field of Classification Search ................ 385/90, 385/88, 89
See application file for complete search history.

(56) References Cited

U.S. PATENT DOCUMENTS

| | | | | |
|---|---|---|---|---|
| 5,249,245 A | * | 9/1993 | Lebby et al. | 385/89 |
| 5,768,456 A | * | 6/1998 | Knapp et al. | 385/49 |
| 6,315,463 B1 | * | 11/2001 | Kropp | 385/88 |
| 6,318,909 B1 | * | 11/2001 | Giboney et al. | 385/90 |
| 6,550,982 B1 | * | 4/2003 | Auburger et al. | 385/88 |
| 6,623,178 B1 | * | 9/2003 | Sakurai et al. | 385/92 |

* cited by examiner

*Primary Examiner*—Sung Pak
(74) *Attorney, Agent, or Firm*—Workman Nydegger

(57) ABSTRACT

The invention relates to an optoelectronic module with at least one carrier element, at least one optoelectronic component that is connected to the carrier element and can emit and/or receive light, and at least one adjusting opening arranged in the carrier element for receiving at least one adjusting means. An exact positioning of the optoelectronic module can be achieved through the adjusting opening arranged in the carrier element. The invention also relates to an optoelectronic system with at least one said optoelectronic module, at least one base part and at least one adjusting means that is arranged in the base part and passes through the at least one adjusting opening of the carrier element of the optoelectronic module.

13 Claims, 4 Drawing Sheets

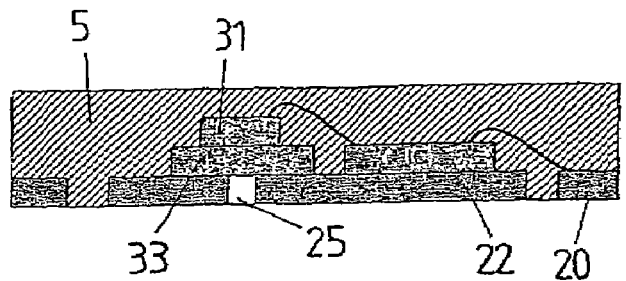
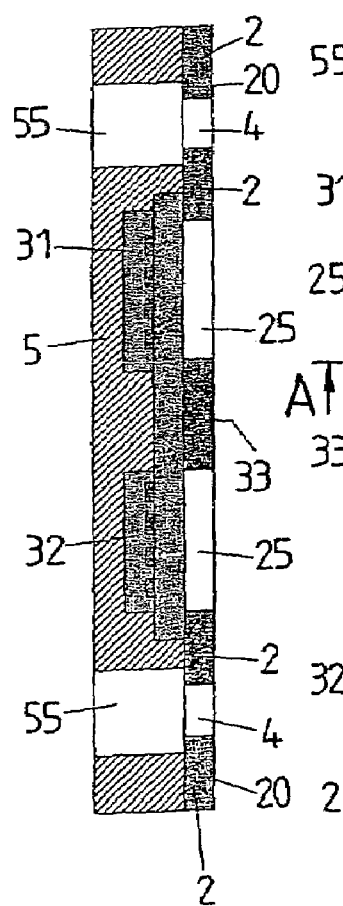
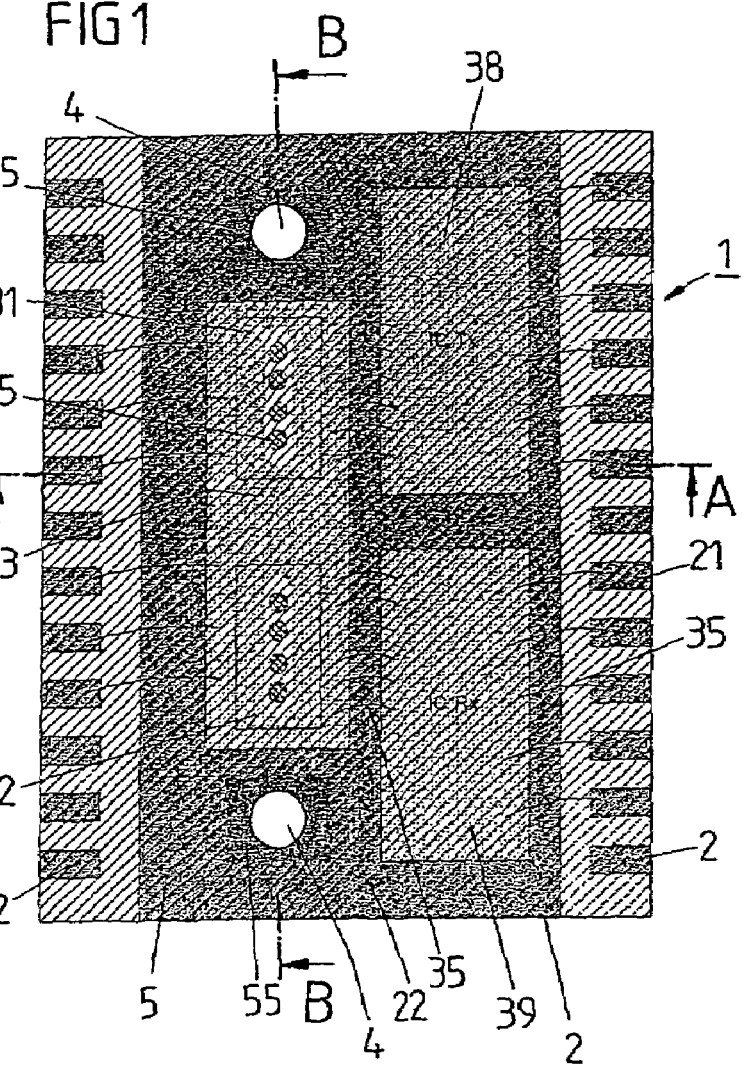

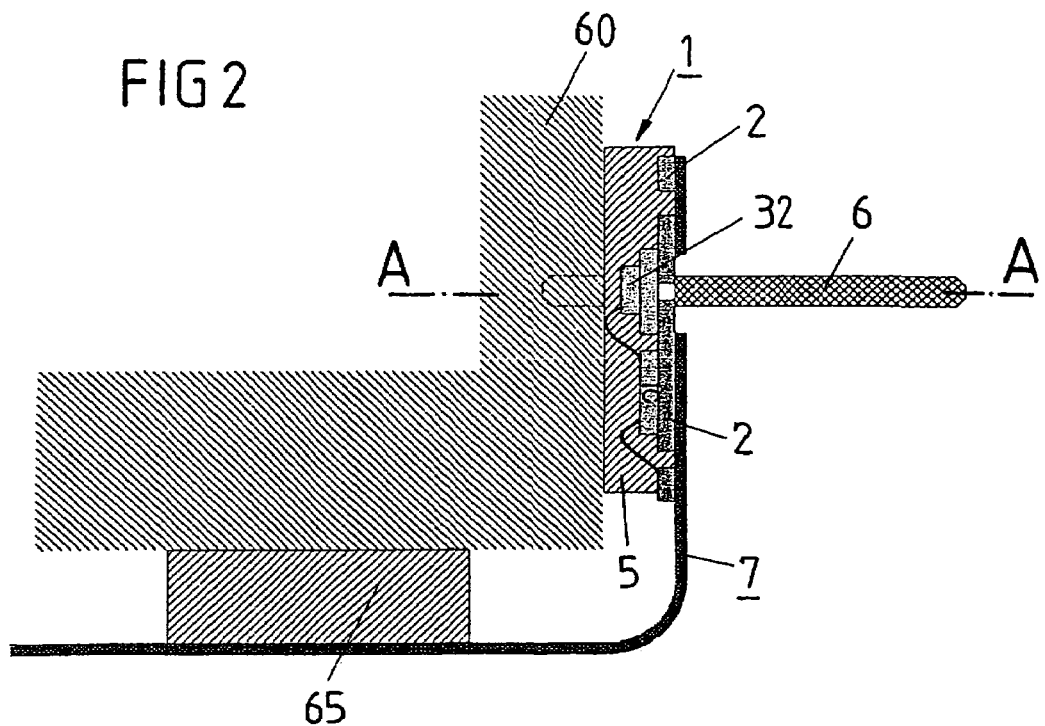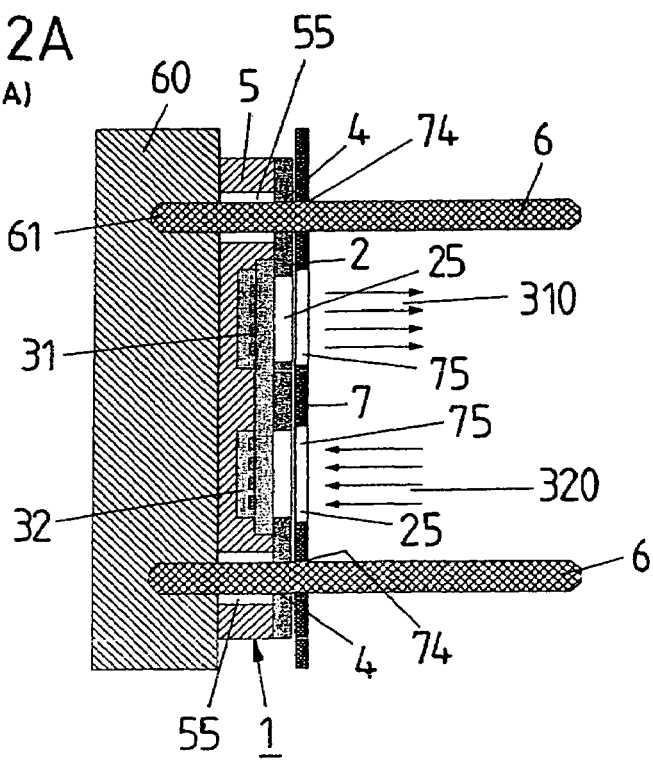

OPTOELECTRONIC MODULE AND OPTOELECTRONIC SYSTEM

FIELD OF THE INVENTION

The invention relates to an optoelectronic module according to the preamble of claim 1 and to an optoelectronic system.

BACKGROUND OF THE INVENTION

In view of the increasing requirements for fast and reliable optical data transmission paths, optoelectronic components are becoming ever more important. The coupling of these optoelectronic components to optical transmission paths, such as light-conducting fibers or optical printed circuit boards for example, requires a high degree of accuracy of the spatial adjustment of the optoelectronic components in relation to the respective optical data transmission paths in order to achieve a low-loss coupling between the optical components.

In the case of known optical connector systems, as shown for example in FIG. 4, a first connector 100 and a second connector 200 are joined to one another. The end regions of light-conducting fibers 110, 210 are respectively introduced into the connectors 100, 200, so that the respective coupling surfaces of the light-conducting fibers 110, 210 are arranged on the respective front side 120, 220 of the respective connectors 100, 200. An exact adjustment of the respective coupling surfaces in relation to one another is achieved in the case of this shown connector system by means of adjusting pins 250, these adjusting pins 250 being held in the one connector 200 and the other connector 100 having corresponding clearances receiving the adjusting pins 250.

When the two connector parts 100, 200 of the connector system shown in FIG. 4 are joined together, the respective coupling regions of the light-conducting fibers 110, 210 are in this way aligned with one another. After joining together, this connector system can be locked with a clip 300, which has resilient engaging regions 350, which engage behind the respective rear side of the connectors.

Such an alignment of two optical connectors by adjusting pins is also described for example in the article "The MT-RJ connector—how it all fits together" by Eric Leichter, Corning Cable Systems.

Furthermore, in the article from Agilent Technologies: "Agilent Technologies singlemode small form factor (SFF) module incorporates micromachined silicon, automated passive alignment, and non-hermetic packaging to enable the next generation of low-cost fiber optic transceivers", it is shown how such a connector with two adjusting pins may be constructed.

However, as described at the beginning, the requirement for exact adjustment does not only arise in the case of connectors, but in particular also in the case of the connection of active electrooptical components to corresponding optical transmission paths, for example light-conducting fibers or optical printed circuit boards.

SUMMARY OF THE INVENTION

The invention provides an optoelectronic module with at least one carrier element, at least one optoelectronic component which is connected to this carrier element and can emit and/or receive light and at least one adjusting opening arranged in the carrier element for receiving at least one adjusting means.

The integration of the at least one adjusting opening in the carrier element allows the optoelectronic module to be positioned exactly. In this case, the adjusting opening can be precisely produced in the carrier element, it then being possible for the optoelectronic component that is connected to the carrier element to be aligned in relation to this adjusting opening exactly in relation to a further optical component, in that, with the aid of the adjusting openings and an adjusting means arranged on the further optical component, in particular with an adjusting pin passing through the adjusting opening of the electrooptical module, the optoelectronic module is positioned exactly.

In one example, there is a definable spatial relationship between the adjusting opening and the optoelectronic component. Therefore, in the case of connection to an optical printed circuit board for example, the optoelectronic module can be exactly aligned by means of further adjusting means, in that the optoelectronic module is merely fitted onto these adjusting means. In this way, a self-adjustment of the electrooptical module is possible, so that low-cost and quick assembly is possible. Further, cost-intensive steps for adjustment are then not necessary.

The carrier element and the optoelectronic component are advantageously surrounded at least partly by a plastic, a clearance being provided in the plastic at least in the region of the at least one adjusting opening. Simple to handle optoelectronic modules which have the customary forms of housing or packages for electronic modules can be achieved in this way.

A low-cost optoelectronic module is produced in this case if the clearance in the plastic has a greater extent in the plane of the carrier element than the adjusting opening. Among the ways in which the cost saving is achieved here is that the respective injection mold can be made relatively imprecisely in the region of the adjusting opening, since the actual adjustment of the optoelectronic module in relation to its respective counterpart, in one example, is only performed by means of the adjusting opening in the carrier element. This configuration of the invention also achieves the effect that the adjustment is performed exclusively via the adjusting opening arranged in the carrier element, whereby the accuracy of the adjustment is increased. Any inaccuracies in the plastic molding then have no effect.

To allow adjusting pins of different lengths to be used, and to obtain independence from the respective arrangement of the optoelectronic module, the clearance in the plastic together with the adjusting opening form a continuous channel. The respective adjusting means, in particular an adjusting pin, can then be inserted through this continuous channel, so that it enters the optoelectronic module at one end of the channel and leaves the optoelectronic module again at the other end of the channel.

To be able to shield light-sensitive optoelectronic components or avoid the emission of stray radiation, the plastic is advantageously non-transparent, at least to the light emitted and/or received by the at least one optoelectronic component.

A simple to handle and electrically simple to contact optoelectronic module can be obtained by forming the carrier element as a leadframe which has at least one contactable contact surface, the leadframe together with the plastic forming a surface-mountable component, in particular an SMD, TSSOP or VQFN component.

A leadframe is understood here as meaning a metal or metallized carrier element which has at least one contact surface which can be contacted from the outside, which can be electrically contacted from the outside after production of the optoelectronic module has been completed, in particular after encapsulation with plastic, and by means of which an optoelectronic component located inside the optoelectronic module can be electrically contacted.

Simple contacting of the optoelectronic module and dissipation of heat can be achieved by the carrier element having at least one surface on which no plastic is arranged. The contactings can then be carried out on this surface of the carrier element and, for example, a heat sink can be arranged on it.

A simple arrangement of the optoelectronic component on the carrier element can be performed by the optoelectronic component being arranged on at least one intermediate carrier connected to the carrier element, the intermediate carrier being substantially transparent to the light emitted and/or received by the optoelectronic component. This allows the light emitted or received by the optoelectronic component to be received or emitted through the intermediate carrier.

In order to obtain a completely functional optoelectronic module, at least one further electronic component, in particular a passive and/or active component, is connected to the carrier element. The optoelectronic component is advantageously electrically connected to the carrier element by means of at least one bonding wire.

The invention also provides an optoelectronic system with at least one optoelectronic module of the specific type described above, at least one base part and at least one adjusting means which is arranged in the base part and passes through at least one adjusting opening of the carrier element of the optoelectronic module.

The system is designed for the optoelectronic module to be adjusted as simply and precisely as possible.

In order to achieve good heat dissipation, the base part is advantageously formed as a heat sink.

The electrical contacting of the optoelectronic module can be achieved by the provision of a printed circuit board, which is connected to the optoelectronic module and which has at least one adjusting opening which is passed through by the adjusting means of the at least one base part. In this way, the electrically conducting printed circuit board is also adjusted in relation to the optoelectronic module by the adjusting means, so that the electrical contacting is likewise performed in a substantially self-adjusting manner. The printed circuit board or the optoelectronic module may in this way be simply fitted onto the adjusting means, without further adjusting steps being necessary.

The printed circuit board is in this case advantageously formed such that it is flexible and is connected to further electronic components, in particular active components.

In a development of the invention, the base part is an optical printed circuit board and the at least one adjusting means is arranged on this printed circuit board in such a way that at least one optical channel arranged in the optical printed circuit board can be optically coupled to at least one optical component of the optoelectronic module. A simple, quick and precise adjustment of the optoelectronic module on the optical printed circuit board is achieved as a result.

BRIEF DESCRIPTION OF THE DRAWINGS

The invention is described in more detail below on the basis of the figures of the drawings, in which:

FIG. 1 shows a plan view of an optoelectronic module with adjusting openings,

FIG. 1A shows a sectional representation through the optoelectronic module of FIG. 1 along the section A—A, FIG. 1B shows a sectional representation through the optoelectronic module of FIG. 1 along the section B—B, FIG. 2 shows a sectional representation through an optoelectronic system with an optoelectronic module, a base part and an adjusting means, FIG. 2A shows a sectional representation of the optoelectronic system shown in FIG. 2 along the sectional line A—A.

DETAILED DESCRIPTION OF THE INVENTION

Figure 3:
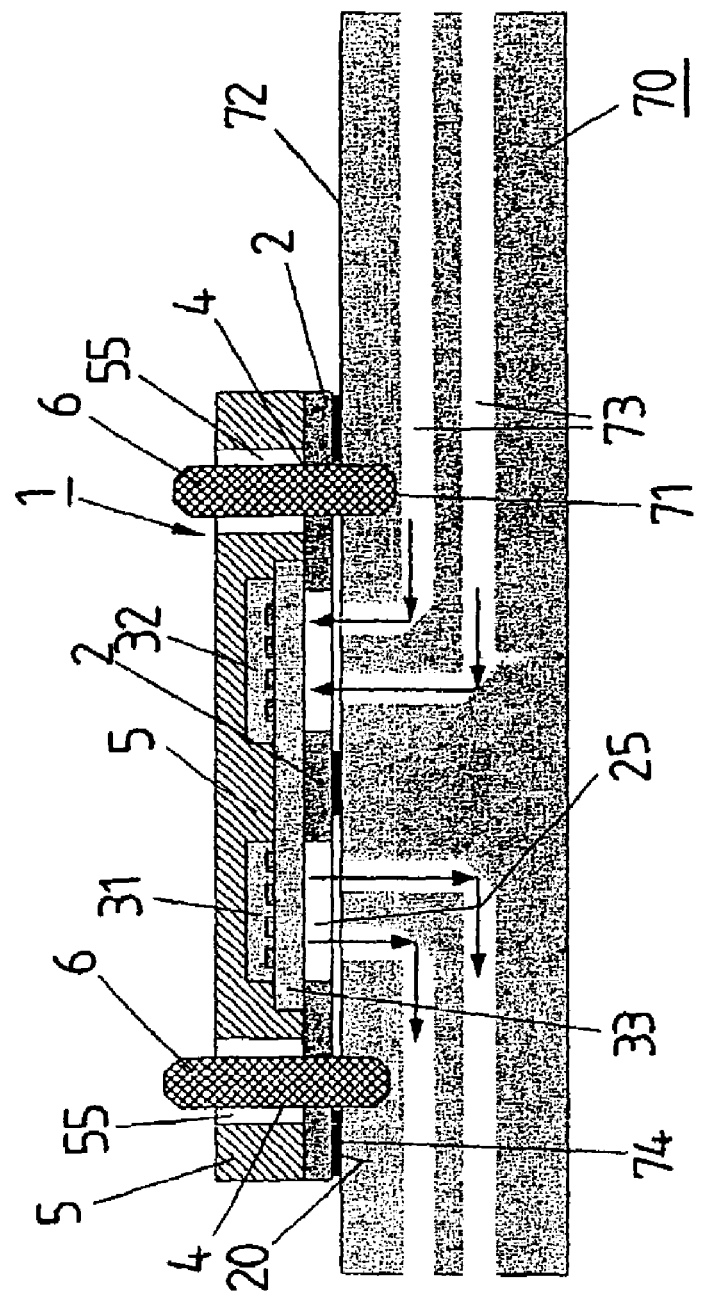
FIG. 3 shows an optoelectronic system with an optoelectronic module and an optical printed circuit board.
Figure 4:
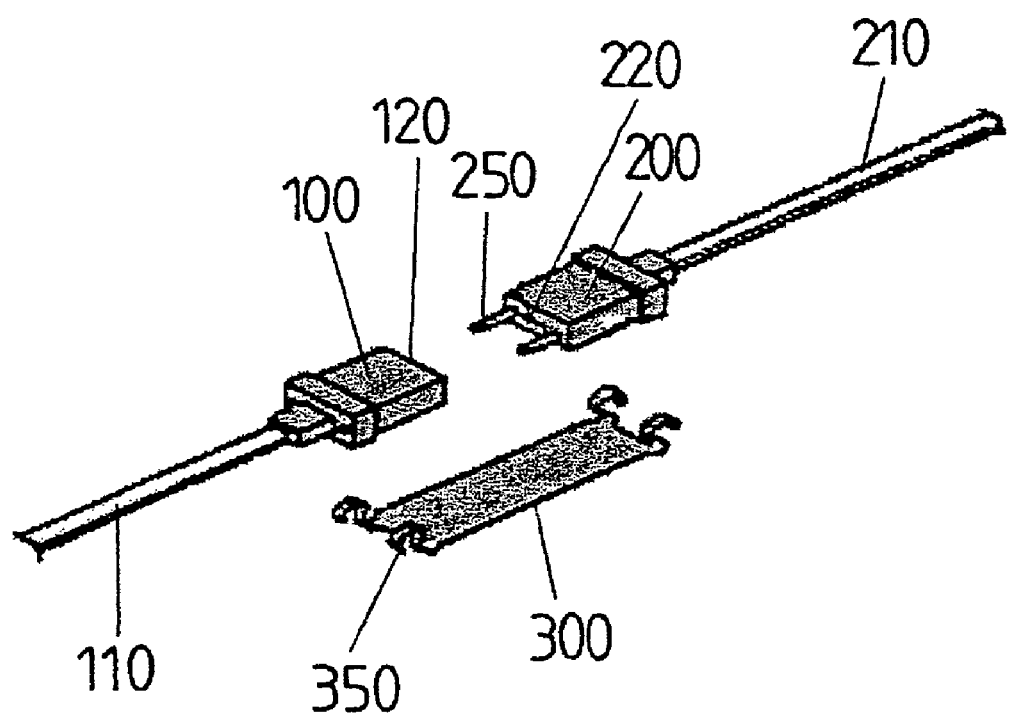
FIG. 4 shows a connector system according to the prior art.

In the detailed description of the figures which follows, the same reference numerals are used for the same components, even if different embodiments are concerned.

The plan view of FIG. 1 and the respective sectional representations in FIGS. 1A and 1B show an optoelectronic module 1 with a carrier element 2, optoelectronic components 31, 32 arranged on the carrier element 2 and also adjusting openings 4, which are arranged in the carrier element 2.

The carrier element 2 is a leadframe, which has contact regions (leads) 21, in one example, on its outer periphery has inside a carrier area 22 (die pad) for an optoelectronic component 31, 32 or an intermediate carrier (substrate) 33, on which such a component is arranged. The contact regions 21 have on their underside contact surfaces 20, which serve for the electrical contacting of the finished optoelectronic module 1. As can be seen in the plan view of FIG. 1, the contact regions 21 of the leadframe 2 are not electrically connected to those of the carrier area 22.

During the production of such an optoelectronic module 1, at first all the parts of the leadframe 2 are held in a larger outer frame, which is punched away after production of the optoelectronic module has been completed. Also arranged in the leadframe 2 are optical windows 25, through which light can enter or leave the optoelectronic components 31, 32. The optoelectronic components are formed here as a light-emitting VCSEL laser 31 and as a photodetector chip 32. Four active regions are respectively provided in this case, so that the optoelectronic module 1 has four transmitting channels and four receiving channels.

Arranged on the leadframe 2, in the leadframe region 22 arranged in the inner area, there is firstly an intermediate carrier 33, on which the respective optoelectronic component 31, 32 is arranged. The intermediate carrier 33 is in this case substantially transparent to the light emitted or received by the respective optoelectronic component 31, 32. The intermediate carrier may in this case be a silicon substrate, for example, or some other semiconductor or a glass substrate. Arranged here as optoelectronic components on the intermediate carrier 33 are on the one hand a laser chip 31 and on the other hand a photodetector chip 32. The respective active regions of the respective optoelectronic component 31, 32 are in this case arranged over the optical window 25 of the leadframe 2, so that light can enter and leave through this optical window 25 through the leadframe 2.

As can be further seen in the plan view of FIG. 1, further electronic components 38, 39, which serve for controlling the respective optoelectronic component 31, 32, are arranged on the leadframe 2. Electrical connections between the individual contact portions 21 of the leadframe, between the additional electronic components 38, 39 and the intermediate carrier 33 or the optoelectronic components 31, 32 are performed in the embodiment shown here by means of bonding wires 35. The electrical connection of the optoelectronic component 31, 32 to the intermediate carrier 33 may also take place by means of flip-chip mounting.

As shown in FIGS. 1 and 1B, adjusting openings 4, which in the embodiment shown here are formed as circles, are also arranged in the leadframe 2. The adjusting opening can in this case be precisely introduced into the leadframe 2, either by punching or by etching.

The entire arrangement is surrounded by a preferably non-transparent plastic 5. As shown in FIG. 1B, a clearance 55 is provided in the plastic in the region of the adjusting opening 4, so that a continuous channel 4, 55, comprising the clearance 55 and the adjusting opening 4, is formed. As shown in FIG. 1 and FIG. 1B for example, the clearance has in this case a greater extent in the plane of the leadframe 2 than the adjusting opening 4 itself. In this embodiment, the clearance 55 is also formed as a square, as shown in FIG. 1 for example, whereas the adjusting opening 4 is round. However, any other forms may also be used here.

Here, the plastic 5 forms the actual outer form of the module housing or the package, so that the optoelectronic module shown in FIGS. 1, 1A and 1B is substantially a VQFN (very thin profile quad flat non leaded package), that is to say a package without contact leads. The plastic may also be formed here as non-transparent plastic, so that the optoelectronic components 31,32 are optically shielded.

Shown in FIG. 2 is an optoelectronic system in which an optoelectronic module 1, which substantially corresponds to that shown in FIGS. 1, 1A and 1B, is connected to a base part 60, which is formed as a heat sink.

A section through the optoelectronic system of FIG. 2 along the sectional direction A—A is shown in FIG. 2A. Here it can clearly be seen that two adjusting pins 6 are connected to the heat sink 60, the adjusting pins being respectively fixed in a blind-hole bore 61 of the heat sink 60. The optoelectronic module 1 is in this case fitted with its adjusting openings 4 onto the adjusting pin 6. In FIG. 2A it can be clearly seen that the region 55 with a clearance in the plastic 5 is passed through by the adjusting pin, without the adjusting pin coming into contact with the plastic 5. The adjustment of the optoelectronic module 1 therefore takes place exclusively via the adjusting openings 4 arranged in the leadframe 2, since there is no contact with the plastic 5 by the adjusting pins 6.

Also provided is a flexible printed circuit board 7, arranged on which are further active components 65, which adjoin the heat sink 60. Here, the flexible printed circuit board is made in a rectangular form, so that the further active components 65 are arranged in a region of the printed circuit board 7 which is perpendicular to the region assigned to the electrooptical module 1.

In the region of the adjusting pins 6, the flexible printed circuit likewise has openings 74, with which the printed circuit board 7 is adjusted in relation to the optoelectronic module 1. This also allows the electrical contacting to be performed in a simple and virtually self-adjusting manner.

Openings 75 in the flexible printed circuit board 7 make it possible for light 310, 320 to pass directly through to the optical windows 25 in the leadframe.

Here, the adjusting pins 6 are of a great length, so that an optical connector can still be pushed onto the adjusting pins 6 for the optical connection of the electrooptical module 1 to a light-conducting fiber. Such an optical connector is not shown here, but can be adjusted with respect to the electrooptical components 31, 32 of the electrooptical module 1 by means of the adjusting pins 6.

FIG. 3 shows an electrooptical system with an electrooptical module 1 in a further configurational variant. Provided here as the basis of the system is an optical printed circuit board 70, in which optical channels or optical waveguides 73 run. In the optical printed circuit board 70, adjusting pins 6 are also arranged in blind-hole bores 71. The optoelectronic module 1 is pushed with its adjusting openings 4 onto the adjusting pins 6. As a result, the optoelectronic components 31, 32 of the optoelectronic module 1 are adjusted with the coupling regions of the optical channels 73 in such a way that a coupling of light into the electrooptical components 31, 32 or out of the electrooptical components into the optical channels 73 of the optical printed circuit board 70 is exactly possible.

The electrooptical module 1 is in this case mounted at its contact surfaces 20 on the optical printed circuit board 70 by means of solder points 74. Electrical conductor tracks 72, which run on the optical printed circuit board 70, can in this case also be contacted with respect to the electrooptical module 1 by means of the solder points 74.

The invention claimed is:

1. An optoelectronic module, comprising:
   at least one optoelectronic component configured to emit or receive light;
   a carrier element configured to support the at least one optoelectronic component thereon, wherein the carrier element comprises at least one adjusting opening arranged therein that is configured to receive an adjusting element when coupling the module to another component or module, and wherein the carrier element comprises a leadframe that has at least one conductive contact surface, and wherein the carrier element further comprises at least one optical window opening therein corresponding generally to the at least one optoelectronic component, respectively, wherein the at least one optical window opening is configured to permit a transmission of light that is emitted or received by the at least one optoelectronic component, respectively; and
   a cover surrounding at least a top portion of the carrier element and the at least one optoelectronic component, the cover comprising at least one clearance therein in one or more regions corresponding to the at least one adjusting opening, respectively, wherein the cover comprises a plastic material that is non-transparent at least to the light emitted or received by the at least one optoelectronic component, the leadframe together with the cover forming a surface-mountable component.

2. The optoelectronic module of claim 1, wherein the at least one clearance has a greater extent in a plane of the carrier element than the at least one adjusting opening, respectively.

3. The optoelectronic module of claim 1, wherein the at least one clearance in the cover together with the at least one adjusting opening in the carrier form a continuous channel.

4. The optoelectronic module of claim 1, wherein the carrier element comprises at least one surface on which the cover is not arranged.

5. The optoelectronic module of claim 1, further comprising at least one intermediate carrier coupled between the carrier and the at least one optoelectronic component, wherein the at least one optoelectronic component is arranged on the at least one intermediate carrier connected to the carrier element, wherein the at least one intermediate carrier is substantially transparent to the light emitted or received by the at least one optoelectronic component, respectively.

6. The optoelectronic module of claim 1, further comprising at least one further electronic component connected to the carrier element and selectively coupled to the at least one optoelectronic component.

7. The optoelectronic module of claim 1, further comprising at least one bonding wire coupled between the at least one optoelectronic component and the carrier element to facilitate an electrical connection therebetween.

8. The optoelectronic module of claim 1, wherein the at least one optoelectronic component comprises a semiconductor laser chip or a semiconductor photodetector.

9. An optoelectronic system, comprising:
   at least one optoelectronic module, comprising:
      at least one optoelectronic component configured to emit or receive light; and
      a carrier element configured to support the at least one optoelectronic component thereon, wherein the carrier element comprises at least one adjusting opening arranged therein that is configured to receive an adjusting element, and wherein the carrier element comprises a leadframe that has at least one conductive contact surface, and wherein the carrier element further comprises at least one optical window opening therein corresponding generally to the at least one optoelectronic component, respectively, wherein the at least one optical window opening is configured to permit a transmission of light that is emitted or received by the at least one optoelectronic component, respectively;
      a cover surrounding at least a top portion of the carrier element and the at least one optoelectronic component, the cover comprising at least one clearance therein in one or more regions corresponding to the at least one adjusting opening, respectively, wherein the cover comprises a plastic material that is non-transparent at least to the light emitted or received by the at least one optoelectronic component, the leadframe together with the cover forming a surface-mountable component;
   at least one base part; and
   the adjusting element arranged in the base part and configured to pass through the at least one clearance of the cover and the at least one adjusting opening of the carrier element of the at least one optoelectronic module.

10. The optoelectronic system of claim 9, wherein the base part comprises a heat sink.

11. The optoelectronic system of claim 9, further comprising a printed circuit board coupled to the at least one optoelectronic module, the printed circuit board comprising at least one adjusting opening generally corresponding to the at least one adjusting opening of the carrier element, and configured to permit the adjusting element to pass therethrough.

12. The optoelectronic system of claim 11, wherein the printed circuit board is flexible and is connected to further electronic components.

13. The optoelectronic system of claim 9, wherein the base part comprises an optical printed circuit board comprising at least one optical channel therein, and wherein the optical printed circuit board and the adjusting element are arranged to facilitate an optical coupling between the at least one optical channel and the at least one optical component of the optoelectronic module.

* * * * *